Figure 1:
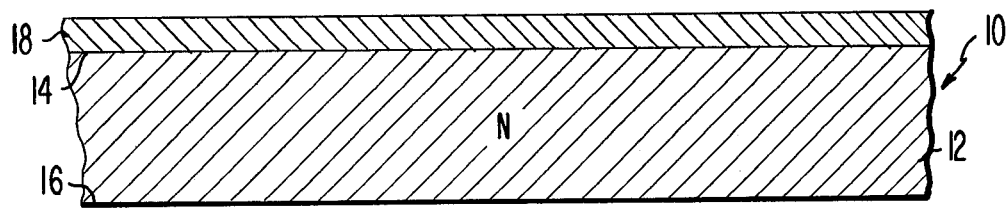

United States Patent [19]

Rosnowski et al.

[11] 4,066,485
[45] Jan. 3, 1978

[54] METHOD OF FABRICATING A SEMICONDUCTOR DEVICE

[75] Inventors: Wojciech Rosnowski, Summit; Richard Denning, Springfield, both of N.J.

[73] Assignee: RCA Corporation, New York, N.Y.

[21] Appl. No.: 761,426

[22] Filed: Jan. 21, 1977

[51] Int. Cl.² .................................................. H01L 21/225
[52] U.S. Cl. .................................. 148/188; 148/187; 156/654; 156/628
[58] Field of Search ............... 148/188, 187; 156/17, 156/628

[56] References Cited

U.S. PATENT DOCUMENTS

| 3,560,280 | 2/1971 | Nishida | 156/17 |
| 3,579,057 | 5/1971 | Stoller | 29/576 X |
| 3,685,141 | 8/1972 | Sandera | 148/187 X |
| 3,843,428 | 10/1974 | Kraft | 156/17 X |
| 3,886,005 | 5/1975 | Cota et al. | 148/188 |
| 3,972,754 | 8/1976 | Riseman | 148/175 |
| 4,021,269 | 5/1977 | Anthony et al. | 148/1.5 |
| 4,029,528 | 6/1977 | Rosnowski | 148/187 |

Primary Examiner—G. Ozaki
Attorney, Agent, or Firm—H. Christoffersen; R. A. Hays

[57] ABSTRACT

A method of fabricating a semiconductor device comprises steps for forming recesses which can be used in the subsequent visual alignment of photomasks. The novel recess forming steps are so linked with a conventional processing step that the total number of steps required for the formation of the recesses is reduced. The present method is particularly adaptable to the fabrication of unisurface silicon controlled rectifiers wherein a doped isolation-type grid is formed to define each device.

6 Claims, 4 Drawing Figures

METHOD OF FABRICATING A SEMICONDUCTOR DEVICE

The present novel method relates in general to the fabrication of semiconductor devices and, in particular, relates to a method of fabrication which comprises steps resulting in the formation of recesses which can be used for the subsequent visual alignment of photomasks.

During the fabrication of semiconductor devices, various patterns are defined, in various materials which are placed on the semiconductor surface, usually by known photolithographic techniques. Conventional photolithographic techniques include the use of a photomask which allows radiation, usually ultraviolet light radiation, to pass through some portions thereof and prevents radiation from passing through other portions. In order to properly position the photomasks, visual recesses are usually formed in the semiconductor surface prior to any other fabrication steps. These recesses are utilized to insure the alignment of subsequent photomasks thereby insuring the accurate positioning of the various regions within a semiconductor device. Ordinarily, the steps of forming the recesses require that a layer of material, usually silicon dioxide, be first placed on the surface of the semiconductor body. Thereafter, the layer is coated with a photoresist which is then defined by use of known methods, such as etching and photolithography. Then, the oxide is etched away to the surface and a portion of the semiconductor body is also etched to provide recessed portions which act as guides. Finally, the layer of material on the semiconductor surface is removed and the fabrication of the various regions comprising the device is carried out. The recess forming steps and the subsequent processing steps are usually performed separately.

The present novel method provides a more efficient technique for forming similar recesses by combining the recess forming steps with the initial steps of the fabrication of the various regions comprising the devices.

In the drawings:

FIGS. 1 through 4 are partial cross-sectional views of a portion of a semiconductor body at various stages of the present method, not drawn to scale.

The present method can best be understood by describing its steps in conjunction with the fabrication of a particular semiconductor device, for example, a unisurface silicon controlled rectifier (SCR). The workpiece upon which the present method is performed is a portion, indicated generally at 10 in the drawings, of a body 12 of semiconductor material. In this particular embodiment, the body 12 of semiconductor material is a wafer of silicon having first and second opposing surfaces 14 and 16, respectively. The body 12 initially has one type conductivity and preferably has a thickness on the order of about 8 mils (200 micrometers). Preferably, the initial conductivity of the semiconductor body 12 is N type, although it can also be P type.

A unisurface SCR is, in general, a semiconductor device having three PN junctions, not shown in the drawings, two of which extend substantially completely across the device in a direction which is substantially parallel with the first surface 14. As more fully discussed in co-pending application Ser. No. 698,480 filed on June 21, 1976, and assigned to the present Assignee, it is highly desirable to passivate the two PN junctions which extend in the above-stated manner. As discussed in the above-mentioned co-pending application, one method of accomplishing such passivation is to form a P type grid which substantially surrounds a plurality of N type regions in which a plurality of devices are to be formed.

Figure 2:
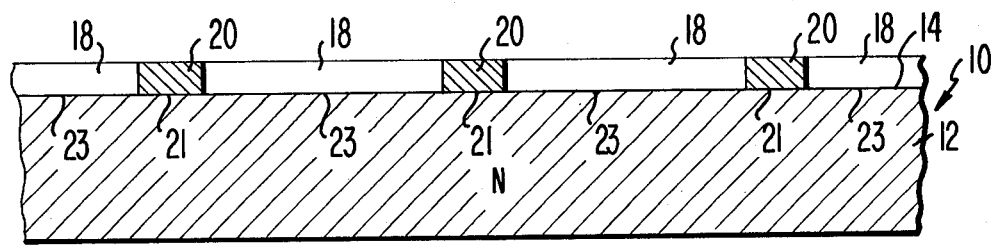

In order to form the grid described above, it is preferred that a layer 18 of aluminum be formed on at least the first surface 14 of the body 12, as shown in FIG. 1. The layer 18 of aluminum may be formed by known methods, for example, vacuum evaporation techniques. The formation technique is preferably carried out for a period of time so that the layer 18 of aluminum has a thickness on the order of about 10,000A. Using known photolithographic and etching techniques, for example, the layer 18 of aluminum is defined into a grid pattern 20 which overlies a portion 21 of the first surface 14, as shown in FIG. 2. The grid pattern 20 can also be formed by other methods known in the art, for example, a layer of material which serves as a diffusion mask for aluminum may be formed and defined to expose the grid pattern 20 on the surface 14. The layer 18 of aluminum is then formed thereon so that the aluminum contacts only the grid pattern portion 21 of the surface 14.

The body 12 is placed in an oven and heated to a temperature of between from about 700° C to about 1300° C in an oxygen-containing ambient atmosphere. At this temperature the aluminum of the grid pattern 20 diffuses into the body 12 to form the P type grid 22, shown in FIGS. 3 and 4. The diffusion is carried out for a preselected period of time. The period of time is chosen so that the grid 22 penetrates the body 12 to a predetermined depth. The depth of the grid 22 is selected, for example, so that the two PN junctions mentioned above, when formed, terminate thereat. Preferably, the diffusion takes place at a temperature of about 1300° C for a period of time on the order of about 20 hours. During the aluminum diffusion the aluminum reacts with the silicon of the body 12 to form an aluminum/silicon alloy 24 on the first surface 14 over the grid 22. Simultaneously, the aluminum, during the diffusion, reacts with the oxygen present in the diffusion ambient to form a cap 26 of aluminum oxide over the aluminum/silicon alloy 24. This cap 26 of aluminum oxide reduces the amount of aluminum available for diffusion. In order to prevent an excessive amount of aluminum oxide from being formed on the alloy 24, and thereby reducing the amount of aluminum available for diffusion into the body 12, the diffusion preferably takes place in an ambient which contains both nitrogen and oxygen. In this embodiment, the ratio of nitrogen to oxygen is on the order of about 6 to 1 by volume. In addition, some of the oxygen present in the ambient reacts with the remainder 23 of the first surface 14 of the body 12 to form a layer 28 of silicon dioxide thereon.

Figure 3:
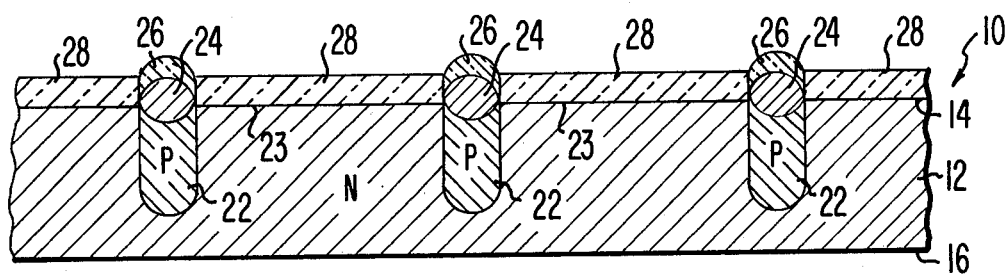

As shown in FIG. 3, upon completion of the diffusion there exists within the semiconductor body 12 a grid 22 having a P type conductivity beneath the oxidized grid pattern 20. Adjacent the surface 14 over the grid 22 there exists an aluminum/silicon alloy 24 which has a cap 26 of aluminum oxide substantially completely thereover. Over substantially all of the remainder of the surface 14 there exists a layer 28 of silicon dioxide which is comparatively lower in height with respect to the surface 14 than the uppermost portion of the cap 26.

The body 12 is then treated with an etchant which attacks the cap 26 of aluminum oxide, the aluminum/silicon alloy 24 and the silicon body 12 at a comparatively much faster rate than it attacks the layer 28 of silicon dioxide. For example, the etchant, in this embodiment, is a 50% aqueous solution of potassium hydroxide (KOH). The potassium hydroxide etches the cap 26 of aluminum oxide and the aluminum/silicon alloy 24, as well as the silicon of the body 12 therebeneath, at a rate which is on the order of about 1000 times faster than the rate at which it etches the layer 28 of silicon dioxide.

Figure 4:
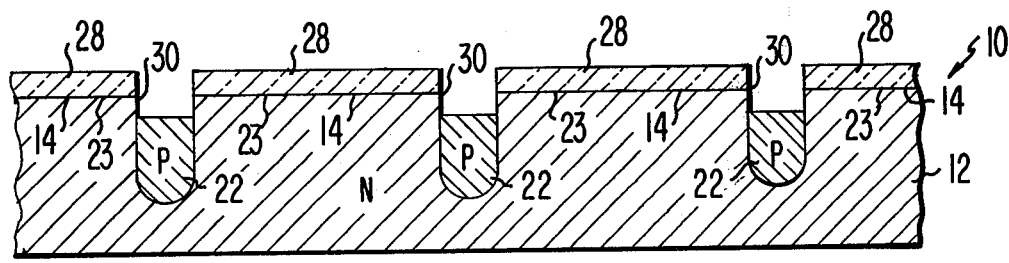

The etching treatment is carried out until recesses 30, shown in FIG. 4, are formed in the body 12. Preferably, this etching step continues for about 10 minutes. Alternatively, if the etchant is megasonically, i.e., at high ultrasonic frequencies, agitated during the etching treatment the treatment time can be reduced to about 2 to 3 minutes. Other etchants such as, for example, a combination of phosphoric acid and sulphuric acid in a one to one volumetric ratio, can also be used.

Upon removing the layer 28 the recesses 30 remain indented in the first surface 14 of the semiconductor body 12. Under the above-stated conditions the recesses 30 extend from the first surface 14 into the body a distance of about 0.2 mils (5 micrometers). Consequently, any layer thereafter formed on the first surface 14 contains indentations which vertically correspond to the recesses 30 in the body 12. Recesses 30 of this type and of this depth are easily seen by one who is aligning subsequent photomasks.

It has been found that while a comparatively thin layer 28 of silicon dioxide is formed during the diffusion process, the integrity of that layer 28 is questionable. This is because the amount of oxygen present in the ambient is comparatively low and thus the thickness of the layer 28 is not great enough to insure a minimum number of pinholes. The layer 28 of silicon dioxide is considered as having failed when an etchant attacks the first surface 14 through the pinholes. This type of failure, because the surface 14 is disrupted, impairs the reliability of the semiconductor device fabricated. Alternatively, a thicker layer 28 of silicon dioxide which has fewer pinholes can be grown in conjunction with the present method during the diffusion step. This is accomplished by changing the ambient, after about 18 to 19 hours of diffusion, from a 6 to 1 nitrogen to oxygen volumetric ratio to a substantially pure steam atmosphere. The steam atmosphere is, therefore, present for the remaining one to two hours of the diffusion process. This method results in a layer 28 of silicon dioxide which is on the order of about 20,000A thick. Such a layer 28 is highly reliable and has comparatively fewer number of pinholes.

At this point, the present method is substantially complete and the remainder of the semiconductor device can be fabricated by known techniques.

The present method reduces a number of steps necessary to form recesses 30 for the visual alignment of photomasks by combining such formation with a diffusion step. While the present method has been described herein with respect to the fabrication of a unisurface SCR, it is not intended to be limited to just that type of device. The present method can be used to fabricate any device in any instance wherein the body 12 of semiconductor material is silicon and the diffused material is aluminum. Furthermore, the present method can be simultaneously performed on both the first and second surfaces 14 and 16, respectively.

What is claimed is:

1. A method of fabricating a semiconductor device comprising the steps of:

heating, in an ambient containing oxygen, a body of silicon having a layer of aluminum on a portion of a surface thereof to a temperature whereat said aluminum diffuses into said body and maintaining said body at said temperature for a preselected period of time, whereby said aluminum diffuses into said body and simultaneously forms an aluminum/silicon alloy on said portion of said surface, said aluminum/silicon alloy having a cap of aluminum oxide thereover, the remainder of said surface having a layer of silicon dioxide simultaneously formed thereon; and treating said body with an etchant which attacks said cap, said alloy and said body at a comparatively faster rate than it attacks said layer of silicon dioxide, said treating step being carried out until recesses are formed in said body beneath said alloy, whereby a photomask can be visually aligned with said recesses.

2. A method as claimed in claim 1 further comprising the step of:

providing an ambient atmosphere during said heating step comprising nitrogen and oxygen.

3. A method as claimed in claim 2 wherein:

said ambient providing step comprises providing an ambient comprising nitrogen and oxygen in a volumetric nitrogen to oxygen ratio of about 6 to 1.

4. A method as claimed in claim 2 wherein:

said heating step is carried out at about 1300° C for about 20 hours.

5. A method as claimed in claim 4 further comprising the step of:

changing said ambient to steam after 18 hours.

6. A method as claimed in claim 1 further comprising the step of:

megasonically agitating said etchant during said treatment.

* * * * *